United States Patent [19]
Hongu et al.

[11] 3,986,145
[45] Oct. 12, 1976

[54] VARIABLE REACTANCE CIRCUIT INCLUDING DIFFERENTIALLY-CONNECTED TRANSISTOR DEVICE PROVIDING A VARIABLE REACTANCE INPUT IMPEDANCE

[75] Inventors: Masayuki Hongu, Komae; Masahiro Tada, Tokyo, both of Japan

[73] Assignee: Sony Corporation, Tokyo, Japan

[22] Filed: June 24, 1975

[21] Appl. No.: 589,903

[30] Foreign Application Priority Data
July 4, 1974  Japan.............................. 49-76779

[52] U.S. Cl. .................. 332/16 T; 331/116 R; 331/177 R; 332/26; 332/30 R; 333/80 T
[51] Int. Cl.[2]................. H03B 5/36; H03C 3/14; H03H 11/00
[58] Field of Search ............ 332/16 T, 29 R, 30 R, 332/26; 331/116 R, 117 R, 177 R; 333/80 R, 80 T

[56] References Cited
UNITED STATES PATENTS
3,717,826   2/1973   Legler ........................ 331/117 R

*Primary Examiner*—Siegfried H. Grimm
*Attorney, Agent, or Firm*—Lewis H. Eslinger; Alvin Sinderbrand

[57] ABSTRACT

A variable reactance circuit is composed of a differential amplifier having first and second emitter-coupled transistors, a reactance element, such as a capacitor, connected between the collector and base electrodes of the first transistor, and a control signal source connected to the emitter electrodes of the transistors by which the input impedance of the first transistor is effective as a variable reactance which is changed in accordance with the level of the control signal. Such variable reactance circuit may be used with an oscillator or resonance circuit to constitute a frequency modulator controlled by the control signal source.

10 Claims, 8 Drawing Figures

VARIABLE REACTANCE CIRCUIT INCLUDING DIFFERENTIALLY-CONNECTED TRANSISTOR DEVICE PROVIDING A VARIABLE REACTANCE INPUT IMPEDANCE

BACKGROUND OF THE INVENTION

1. Field of the Invention

This invention relates generally to a variable reactance circuit, and is directed more particularly to a variable reactance circuit which is adapted for use in, for example, a variable frequency oscillator, as FM modulator and the like.

2. Description of the Prior Art

In the prior art, there has been proposed a variable reactance circuit employing a varactor diode. However, such variable reactance circuit has a narrow range or variation and is not preferred for formation as an integrated circuit.

It has also been considered to provide a variable capacitive reactance circuit which is composed of a series circuit of a constant current source and a diode, a transistor with its emitter electrode grounded, a control voltage source connected between the base electrode of the transistor and the anode electrode of the diode, and a capacitor connected between the collector electrode of the transistor and the anode of the diode. However, with this type of the variable capacitive reactance circuit, if its output impedance is required to be great, an inductance element is necessary and the capacitance of the capacitor must be made great so as to increase the range of variation of the reactance. The inclusion of an inductance element and/or the need for a capacitor having a very large capacity make it difficult to form this variable capacitive reactance circuit as an integrated circuit.

SUMMARY OF THE INVENTION

Accordingly, an object of this invention is to provide a variable reactance circuit which is free of the above disadvantages of the prior art.

Another object of the invention is to provide a variable reactance circuit in which its capacitance may be small so as to make the circuit suitable for formation as an integrated circuit.

Still another object is to provide a variable reactance circuit, as aforesaid, which may be conveniently provided with a wide range of variation of its reactance.

A further object is to provide a variable reactance circuit, as aforesaid, in which the reactance can be varied without any variation in DC level.

According to an aspect of the invention, a variable reactance circuit comprises a differential amplifier formed of first and second transistors; a reactance element, such as, a capacitor, connected between the collector and base electrodes of the first transistor; a source of DC potential supplied to the base electrode of the second transistor; and a control signal source connected to the connection point between the emitter electrodes of both the transistors so that a reactance component corresponding to the level of the control signal source is obtained as the input impedance of the first transistor. With the foregoing circuit according to the invention, it is not always necessary to provide the same with a very large output impedance, so that a resistor can be used as a load and accordingly the circuit can be easily formed as an integrated circuit. Further, with such variable reactance circuit no DC level variation accompanies changes in the reactance, so that the circuit can be connected directly to a following stage, for example, an oscillator.

The above, and other objects, features and advantages of this invention, will be apparent in the following description when read in conjunction with the accompanying drawings.

DESCRIPTION OF THE PREFERRED EMBODIMENTS

Before describing the present invention and in order to further the understanding of the latter, a prior art variable reactance circuit will be described with reference to FIGS. 1A and 1B.

Figure 1A:
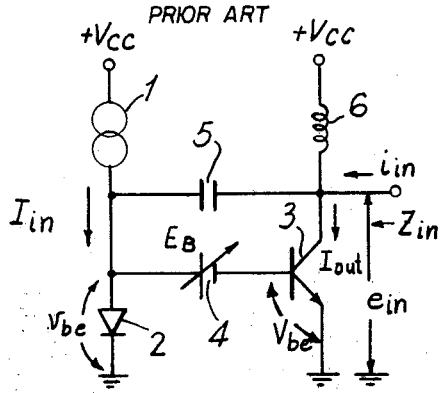
FIG. 1A is a connection diagram showing a prior art variable reactance circuit.

As shown on FIG. 1A, such prior art variable reactance circuit includes a constant current source 1 and a diode 2 connected in series between an operating voltage source $+V_{cc}$ and ground, a transistor 3 whose emitter electrode is grounded, a control voltage source 4 connected between the base electrode of transistor 3 and the anode electrode of diode 2, and a capacitor 5 connected between the collector electrode of the transistor 3 and the anode of the diode 2. Further, as hereinafter described in detail, a suitable collector load 6 is connected between the collector electrode of transistor 3 and the operating voltage source $+V_{cc}$.

Figure 1B:
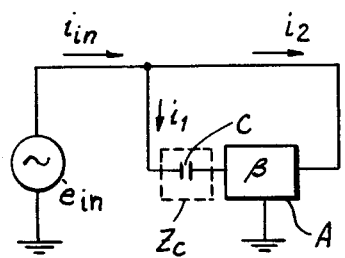
FIG. 1B is an equivalent circuit to that shown in FIG. 1A.

An equivalent to the variable reactance circuit of FIG. 1A can be as shown on FIG. 1B. If in the circuit of FIG. 1B, the current flowing from a signal source $e_{in}$ into a variable reactance circuit is $i_{in}$; the current flowing from the signal source $e_{in}$ through a capacitive reactance $Z_c$ into an amplifier A is $i_1$; the output current from the amplifier A is $i_2$; and the forward current gain of the amplifier A is $\beta$; then the following relationships are established:

$$i_1 = \frac{e_{in}}{Z_c}, \quad i_2 = \beta \cdot i_1,$$

$$i_{in} = i_1 + i_2 = i_1 + \beta \cdot i_1 = e_{in} \frac{1+\beta}{Z_c}$$

Accordingly, the total impedance $Z_{in}$ of the circuit viewed from the signal source to the load is expressed as follows:

$$Z_{in} = \frac{e_{in}}{i_{in}} = \frac{Z_c}{1+\beta} \qquad (1)$$

One of the practical circuits which may change the current gain of the amplifier A is the circuit shown in FIG. 1A. If in the circuit of FIG. 1A, $E_B$ represents the control voltage for transistor 3;
$V_{be}$ represents the base-emitter voltage of transistor 3;
$v_{be}$ represents the anode-cathode voltage of diode 2;
K represents the Boltzmann's constant;
T represents the absolute temperature;
q represents the electron charge;
$I_S$ represents the saturation current of transistor 3 and diode 2;
$I_{out}$ represents the collector current of transistor 3; and
$I_{in}$ represents the current flowing into diode 2; then the following equations (2), (3) and (4) are obtained:

$$v_{be} = \frac{K \cdot T}{q} \ln \frac{I_{in}}{I_s} \quad (2)$$

$$V_{be} = v_{be} - E_B \quad (3)$$

$$I_{out} = I_s \exp \frac{q}{K \cdot T} V_{be} \quad (4)$$

From equations (3) and (4), the collector current $I_{out}$ of transistor 3 is expressed as follows:

$$\begin{aligned} I_{out} &= I_s \exp \frac{q}{K \cdot T}(v_{be} - E_B) \\ &= I_s \exp \frac{q}{K \cdot T}\left(\frac{K \cdot T}{q} \ln \frac{I_{in}}{I_s} - E_B\right) \\ &= I_s \cdot \frac{I_{in}}{I_s} / \exp \frac{q \cdot E_B}{K \cdot T} \\ &= I_{in} / \exp \frac{q \cdot E_B}{K \cdot T} \quad (5) \end{aligned}$$

Since $\beta$ is expressed by the following equation (6)

$$\beta = \frac{I_{out}}{I_{in}} = \exp \frac{-q \cdot E_B}{K \cdot T} \quad (6)$$

the following equation (7) is obtained by substituting equation (6) in equation (1).

$$Z_{in} = Z_c \cdot \frac{1}{1 + \exp(-\frac{q \cdot E_B}{K \cdot T})} \quad (7)$$

If the capacitance of the capacitor 5 is $C_o$, the input impedance
$(Z_{in} = e_{in}/i_{in})$ of transistor 3, that is, the impedance of transistor 3 between its collector electrode and the ground, is expressed as follows:

$$Z_{in} = \frac{1}{j w \cdot C_o} \cdot \frac{1}{1 + \exp(-\frac{q E_B}{KT})} \quad (8)$$

As may be apparent from equation (8), the input impedance $Z_{in}$ can be varied by the control voltage $E_B$ and a variable capacitance can be obtained as the input impedance.

However, with the variable reactance circuit shown in FIG. 1A, the signal current $i_{in}$ is supplied to transistor 3 from its collector, so that if the output impedance of the variable reactance circuit is not great, the signal current $i_{in}$ flows into the collector load 6 to lower the efficiency of the circuit as a capacitive reactance circuit. Accordingly, the described prior art variable reactance circuit generally requires a large coil as the collector load 6 of transistor 3, as shown on FIG. 1A, and hence it is not suited to be formed as an integrated circuit.

Further, in the variable reactance circuit of FIG. 1A, when the control voltage $E_B$ is zero ($E_B=0$), $\beta=1$; and when $E_B=\infty$ $\beta=0$, or the variable range of $\beta$ is $1 \sim 0$ and the input impedance $Z_{in}$ expressed by equation (8) is determined by $C_0$.

Further, if it is desired to obtain a large capacitance, the capacitance of capacitor 5 must be made great, which also makes it difficult to use integrated circuit techniques for forming the circuit. The prior art circuit also requires a relatively high DC voltage, and accordingly, it becomes difficult to directly connect the circuit to the next stage, such as, an oscillator or the like.

The theoretical basis for circuits according to the present invention will now be described with reference to FIG. 2A. In the circuit shown on FIG. 2A, a transistor 7 has its emitter electrode grounded and its collector electrode connected with a load 8. A reactance element 9 is connected between the collector and base electrodes of transistor 7. In such a circuit, the input impedance $Z_{in}'$ viewed from the base electrode of transistor 7, or between such base electrode and the ground, is expressed in the following manner. More particularly, if the mutual conductance of transistor 7 is gm; the impedance of load 8 is $R_L$; the reactance of reactance element 9 is $Z_C'$; the input voltage is $e'_{in}$; the output voltage taken is $e'_{out}$; the input current is $i'_1, i'_2$; and if the input impedance of transistor 7 is assumed to be sufficiently great, the following relationships are established:

$$i'_1 = \frac{e'_{in}}{Z'_C + R_L}, \quad i'_2 = \frac{e'_{out}}{Z'_C + R_L}, \quad e'_{out} = gm \cdot R_L \cdot e'_{in},$$

$$i'_1 + i'_2 = \frac{e'_{in}}{Z'_C + R_L} + \frac{e'_{out}}{Z'_C + R_L} = \frac{e'_{in}}{Z'_C + R_L}\left(1 + \frac{1}{gm \cdot R_L \cdot e'_{in}}\right)$$

Figure 2A:
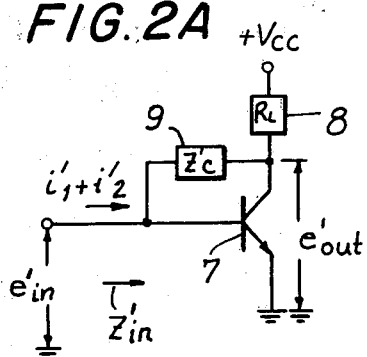
FIG. 2A is a connection diagram to which reference will be made in explaining the theoretical basis for the present invention.
Figure 2B:
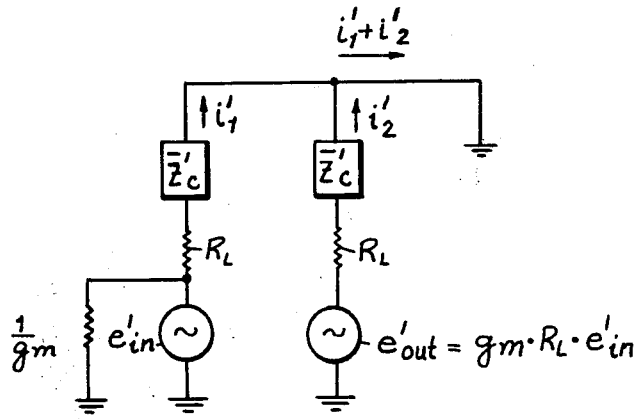
FIGS. 2B and 2C are equivalent circuits to that shown on FIG. 2A.
Figure 2C:
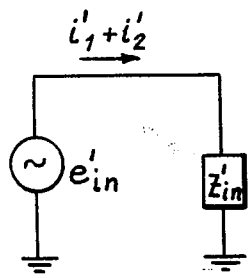

Since the input impedance of transistor 7 is assumed to be sufficiently great, an equivalent to the circuit shown on FIG. 2A can be as shown on FIG. 2C.

Accordingly, the input impedance $Z'_{in}$ of transistor 7 is expressed as follows:

$$Z'_{in} = \frac{e'_{in}}{i'_1 + i'_2} = \frac{Z'_C + R_L}{1 + gm \cdot R_L} \approx \frac{Z'_C + R_L}{gm \cdot R_L} \quad (9)$$

∵ Because $gm \cdot R_L \gg 1$

If the elements are selected to satisfy the condition $Z'_C \gg R_L$, equation (9) may be rewritten as follows:

$$Z'_{in} \approx \frac{Z'_C}{gm \cdot R_L} \quad (10)$$

As will be apparent from equation (10), if the mutual conductance gm of transistor 7 is changed by the control signal, the reactance component which is varied in accordance with the control signal can be obtained as the input impedance $Z'_{in}$.

A practical embodiment of the invention based upon the above theory will now be described with reference to FIG. 3, in which reference numerals 7A and 7B indicate transistors which form a differential amplifier. The transistor 7A has a load resistor 10 connected to its collector electrode and a capacitor 11 as a reactance element connected between its collector and base electrodes, that is, capacitor 11 functions similarly to reactance 9 connected between the collector and base electrodes of transistor 7 on FIG. 2A. The emitter electrodes of transistors 7A and 7B are connected together to the collector electrode of a transistor 13 whose emitter electrode is grounded through a resistor 14 and whose base electrode is connected with a source 15 of a control signal which is superposed on a DC component provided by a source 15a.

Figure 3:
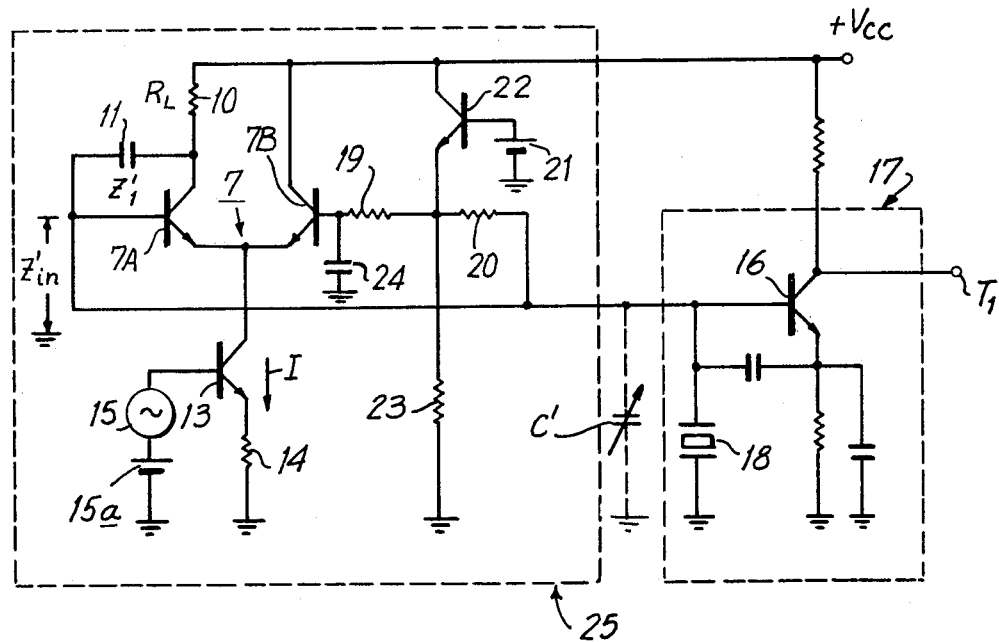
FIG. 3 is a circuit diagram showing a practical embodiment of a variable reactance circuit according to this invention.

In FIG. 3, the variable reactance circuit according to the invention is shown associated with an oscillator 17 which includes a transistor 16. A ceramic vibrator 18 is connected to a feedback path between the emitter and base electrodes of transistor 16, and the base electrode of transistor 16 is connected to the base electrode of transistor 7A. The base electrodes of transistor 7B and of transistors 7A and 16 are supplied with a DC bias through resistors 19 and 20, respectively. The DC bias is produced by a transistor 22 whose base electrode is connected with a DC voltage source 21 and a resistor 23 connected between the emitter electrode of the transistor 22 and the ground. Further, a capacitor 24 for decoupling is connected to the base electrode of transistor 7B.

With the circuit shown on FIG. 3, if the impedance value of load resistor 10 is $R_L$; and the reactance of capacitor 11 is $Z'_C$; then the input impedance $Z'_i$ of transistor 7A, as viewed from its base electrode, can be expressed by the following equation (11) which is similar to equation (10):

$$Z'_i = \frac{Z'_c}{gm \cdot R_L} \quad (11)$$

If the current flowing through transistor 13 is I; and the emitter resistance of each of transistors 7A and 7B is $r_e$; then the input impedance $Z'_d$ of the differential amplifier constituted by transistors 7A and 7B is expressed as follows:

$$Z'_d = 2r_e \cdot \beta \quad (12)$$

where $\beta$ is the current gain of the differential amplifier 7.

In general, the emitter resistance $r_e$ of each of the transistors 7A and 7B which form the differential amplifier is expressed as follows:

$$r_e = \frac{K \cdot T}{q \cdot \frac{I}{2}} \quad (13)$$

where K is the Boltzmann's constant; T the absolute temperature; and q is the electron charge.

Therefore, if equation (13) is substituted in equation (12), $Z'_d$ is rewritten as follows:

$$Z'_d = 2 r_e \beta = 2 \frac{K \cdot T}{q \cdot \frac{I}{2}} \beta = \frac{4K \cdot T}{q \cdot I} \beta \quad (14)$$

Accordingly, if $i_b$ is the base current of transistor 7A, the output voltage $e'_{out}$ of transistor 7A is expressed as follows:

$$e'_{out} = i'_b \cdot R_L \cdot \beta = \frac{e'_{in}}{Z_d} R_L \beta \quad (15)$$

Since the term at the right-hand side of equation (15) must become equal to $gm \cdot R_L \cdot e'_{in}$, the mutual conductance gm of the differential amplifier is expressed as follows:

$$gm = \frac{\beta}{Z_d} = \frac{q \cdot I}{4K \cdot T} \quad (16)$$

If equation (16) is substituted in equation (11), the following equation (17) is obtained.

$$Z'_i = \frac{Z'_c}{\frac{q \cdot I}{4K \cdot T} R_L} = \frac{4K \cdot T \cdot Z'_c}{q \cdot I \cdot R_L} \quad (17)$$

In the embodiment of FIG. 3, if the capacitance of capacitor 11 is C, the reactance $Z'_C$ is $(-j1/wc)$. Therefore, equation (17) is rewritten as follows:

$$Z'_i = \frac{4h}{R_L \cdot I}(-j \frac{1}{wC}) \quad (18)$$

where $h = K \cdot T/q$.

As will be apparent from equation (18), $Z'_i$ depends upon the factor $-j$ or is a capacitive component. Accordingly, the whole circuit within the block 25 shown in broken lines on FIG. 3 can be considered equivalent to a variable capacitance $C'$ which, as is shown in broken lines on FIG. 3, is connected in parallel to the ceramic vibrator 18 of oscillator 17. This variable capacitance $C'$ is varied in proportion to the control current I, and hence the oscillation frequency of oscillator 17 may be varied in response to changes in the control current.

Figure 4:
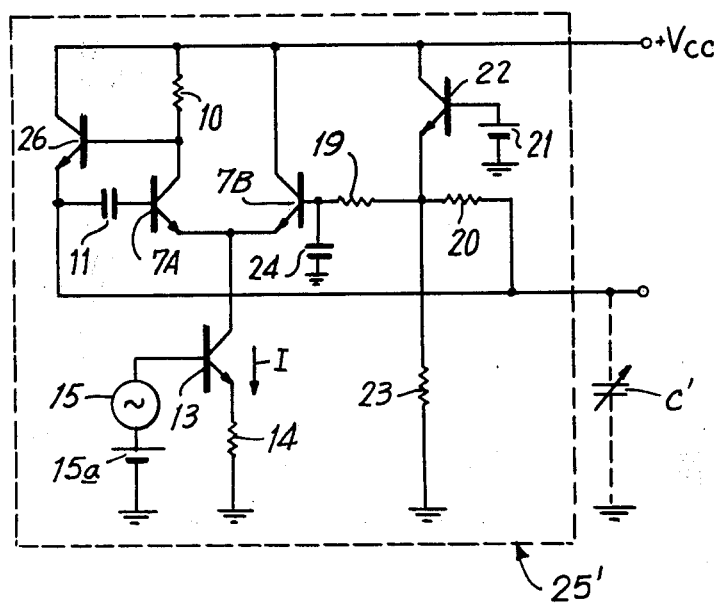
FIG. 4 is a circuit diagram showing another embodiment of the invention.

FIG. 4 shows another embodiment of this invention in which elements corresponding to those shown on FIG. 6 are identified by the same reference numerals.

In the circuit 25' of FIG. 4, an emitter-follower transistor 26, having a current amplification factor $\beta$, is connected between capacitor 11 and the collector of transistor 7A as a buffer load, and the remainder of the circuit is substantially the same as that shown on FIG. 3.

With the circuit 25' of FIG. 4, the equation corresponding to equation (9) is as follows:

$$Z'_{in} = \frac{Z'_c + R'_L}{1 + gm \cdot R_L} = \frac{Z'_c + \frac{R_L'}{1+\beta}}{1+gm \cdot R_L} \quad (19)$$

It will be seen that the above equation (19) is similar to equation (10), so that the term $R_L$ in equation (19) can be more reasonably neglected.

When the variable reactance circuit 25 or 25' according to the invention is connected to oscillator 17, as on FIG. 3, and the control signal source 15 is a modulating signal source, an FM modulated signal can be obtained at an output terminal $T_1$ connected to the collector electrode of transistor 16.

Figure 5:
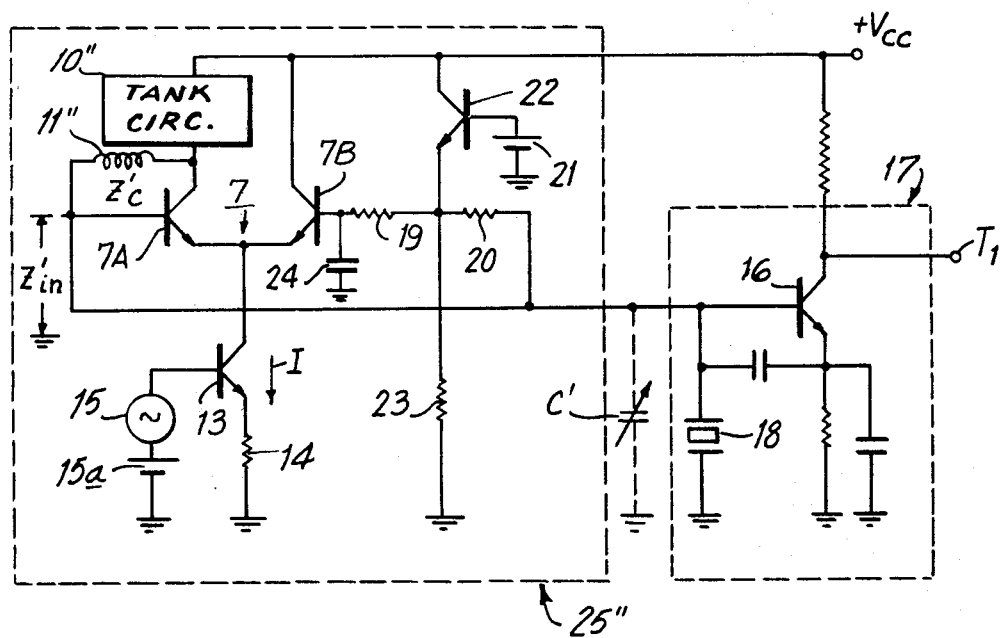
FIG. 5 is a circuit diagram showing a modification of the embodiment illustrated by FIG. 3.

Further, in a variable reactance circuit 25'' according to this invention as shown on FIG. 5, and which may be otherwise similar to the circuit 25 described above with reference to FIG. 3, a tank circuit 10'' may be used in place of the load resistor 10 on FIGS. 3 and 4, or in addition to such load resistor. When such tank circuit 10'' is employed, it is selected to have its impedance variation in the direction opposed to the direction of impedance variation of the equivalent tank circuit contained in the ceramic vibrator 18 of oscillator 17, that is, the impedance of tank circuit 10'' varies inversely in respect to the impedance of the equivalent tank circuit of oscillator 17, so that the output of oscillator 17 will have a constant amplitude. Therefore, when the variable reactance circuit 25'' is used with the oscillator 17 as an FM modulator, the FM modulated output has a constant amplitude and there is no need to provide a limiter therefor.

Further, if desired, in a variable reactance circuit according to this invention, a coil may be used as the reactance element in place of the capacitor 11, for example, as indicated at 11'' on FIG. 5.

Although illustrative embodiments of the invention have been described in detail herein with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A variable reactance circuit comprising first and second transistors each having base, emitter and collector electrodes, said emitter electrodes of said first and second transistors being connected together, a a reactance element connected between said base electrode and said collector electrode of said first transistor, bias circuit means for applying a predetermined DC voltage to said base electrode of at least said second transistor, and a control signal source for applying a control signal to said connected together emitter electrodes of said first and second transistors so that the input impedance of said first transistor, as viewed from its base electrode, constitutes a variable reactance which varies in accordance with the level of said control signal.

2. A variable reactance circuit according to claim 1; in which said reactance element is a capacitor.

3. A variable reactance circuit according to claim 1; in which said reactance element is a coil.

4. A variable reactance circuit according to claim 1; further comprising a load for said first transistor.

5. A variable reactance circuit according to claim 4; in which said load includes a resistor.

6. A variable reactance circuit according to claim 4; in which said load includes a tank circuit.

7. A variable reactance circuit according to claim 1; further comprising an emitter-follower transistor connected between said collector electrode of said first transistor and said reactance element.

8. A variable reactance circuit according to claim 1; in combination with a variable frequency oscillator including a resonance element connected to said base electrode of said first transistor so that said variable reactance controls the frequency of the output of said oscillator.

9. The combination according to claim 8; in which said control signal is an information signal so that said output of said oscillator is frequency modulated by said information signal.

10. The combination according to claim 8; in which said variable reactance circuit further comprises a load for said first transistor including a tank circuit having an impedance which varies inversely in respect to the impedance of an equivalent tank circuit of said resonance element of the oscillator so that the output of said oscillator has a constant amplitude.

* * * * *